US008600713B2

(12) United States Patent
Chen et al.

(10) Patent No.: US 8,600,713 B2
(45) Date of Patent: Dec. 3, 2013

(54) METHOD OF ONLINE BUILDING-MODEL RECONSTRUCTION USING PHOTOGRAMMETRIC MAPPING SYSTEM

(75) Inventors: Liang-Chien Chen, Taoyuan County (TW); Tee-Ann Teo, Batu Pahat (MY); Wen-Chi Chang, New Taipei (TW)

(73) Assignee: National Central University, Jhongli (TW)

( * ) Notice: Subject to any disclaimer, the term of this patent is extended or adjusted under 35 U.S.C. 154(b) by 282 days.

(21) Appl. No.: 13/233,330

(22) Filed: Sep. 15, 2011

(65) Prior Publication Data

US 2012/0265494 A1 Oct. 18, 2012

(30) Foreign Application Priority Data

Apr. 14, 2011 (TW) .............................. 100112908 A

(51) Int. Cl.
*G06G 7/48* (2006.01)
(52) U.S. Cl.
USPC ............................................................ 703/6

(58) Field of Classification Search
USPC .................... 703/6, 7, 8; 382/154; 342/357.31
See application file for complete search history.

(56) References Cited

U.S. PATENT DOCUMENTS

RE41,175 E * 3/2010 Vashisth et al. ........... 342/357.31
2003/0147553 A1 * 8/2003 Chen et al. .................... 382/154

OTHER PUBLICATIONS

McLauchlan, P.F., "Gauge invariance in projective 3D reconstruction", IEEE 1999.*
Chen et al., Online Building Model Reconstruction Using Photogrammetric Mapping Systems, Mapping technology in Taiwan and Fujian Seminar, Oct. 29, 2010, Taiwan, R.O.C.

* cited by examiner

*Primary Examiner* — Kandasamy Thangavelu
(74) *Attorney, Agent, or Firm* — Jackson IPG PLLC

(57) ABSTRACT

The present invention combines an existing photogrammetric mapping system for building-model reconstruction. Topographic maps and models are produced simultaneously. The models can be edited along with aerial images in an online environment. Thus, efficiency and accuracy for building-model reconstruction are increased.

8 Claims, 16 Drawing Sheets

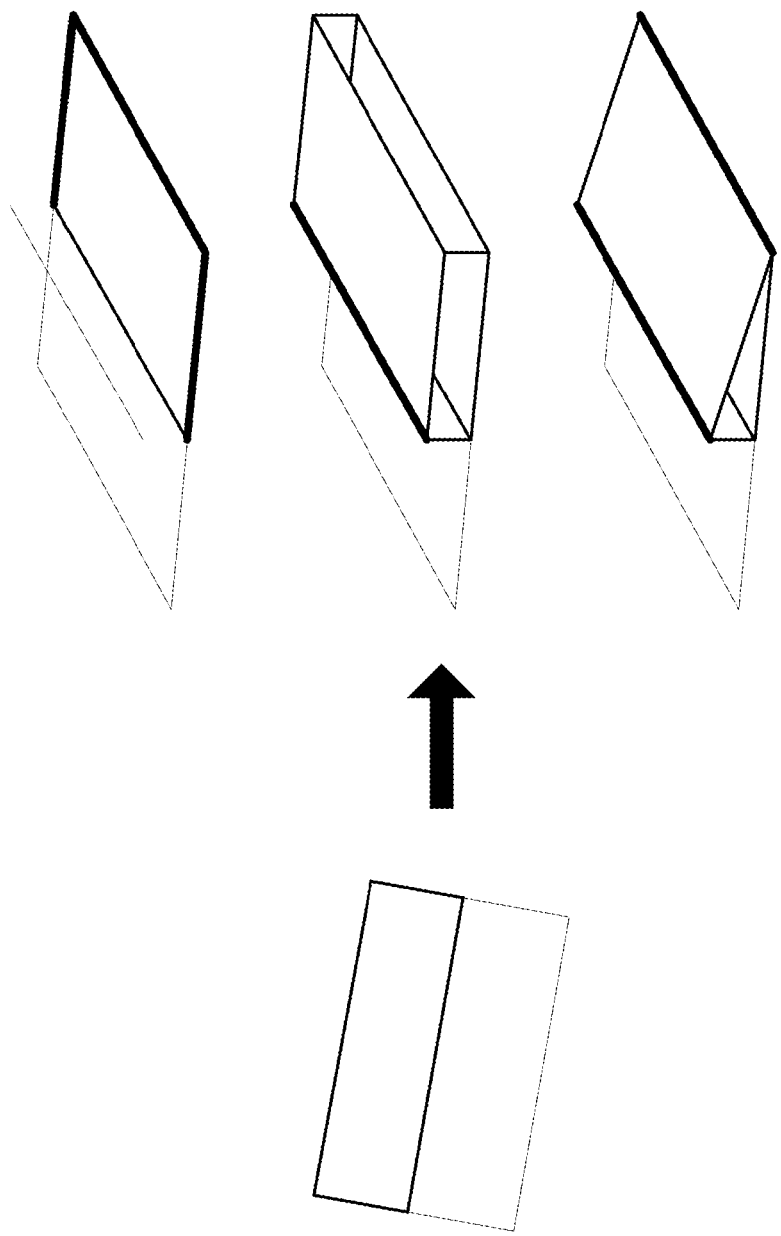

| Software | Socet Set | LPS | Inpho | Virtuozo |
|---|---|---|---|---|
| Modeling module | Urban Modeler | Stereo Analyst | Summit Evolution | IMAGIS |
| Digitization | 3D solid model | 3D polygon | 3D solid model | 3D polygon |
| Connected with Microstation | Yes | Yes | Yes | Yes |

FIG.11

METHOD OF ONLINE BUILDING-MODEL RECONSTRUCTION USING PHOTOGRAMMETRIC MAPPING SYSTEM

TECHNICAL FIELD OF THE DISCLOSURE

The present invention relates to building-model reconstruction; more particularly, relates to using a photogrammetric mapping system to digitize 3D line segments online for forming 3D models to be compared and edited with stereo aerial images for enhancing efficiency and accuracy for building-model reconstruction.

DESCRIPTION OF THE RELATED ARTS

Three-dimensional (3D) data manipulation is a major tendency in geographic information systems (GIS). The building-model reconstruction is an important task among others. The data used include aerial images and light detection and ranging (LIDAR) point clouds for building reconstruction. Aerial images are favorable in terms of better spatial resolution in photogrammetry. Although conventional photogrammetric mapping is performed in a 3D environment, 2D vector data is recorded for traditional topographic map in many countries. Thus, the mapping process would not record the height information of man-made objects. It makes the building reconstruction hard or unreliable.

The building-model reconstruction process mainly includes the following two categories. The first building-model reconstruction process is an off-line process. In a first stage, a photogrammetric mapping system is used to measure 3D building line-segments. In a second stage, the 3D building line-segments are output for reconstruction of 3D building models. Yet, the 3D building models are not formed online and so inconvenience happens. Furthermore, the two-stage processes are not compatible with the photogrammetric mapping system.

The second mapping process directly forms 3D models from the photogrammetric mapping system yet with a few limits. A stereo measurement operator must measure every 3D closed roof polygons and then form 3D building models with the 3D closed roof polygons. Although the process is an online process, every roof edge is processed through redundant measurements and an abundant of measurements is thus taken. Moreover, when a building corner is occluded by vegetation, the measured closed roof polygon containing the occluded building corner is not reconstructed.

Traditional photogrammetric mapping systems measure 3D lines of man-made object but generalize into 2D system. Hence, height information loss happens and results in difficult interpretation and topological error on reconstructing 3D building models. As shown in FIG. 11, a few well-known photogrammetric mapping software support 3D modeling. They all provide model reconstruction module yet for 3D solid models or 3D polygons only but not for 3D polylines, which are more flexible for model reconstruction. When only 3D solid models or 3D polygons can be digitized, problems may occur. Hence, the prior arts do not fulfill all users' requests on actual use.

SUMMARY OF THE DISCLOSURE

The main purpose of the present invention is to use a photogrammetric mapping system to digitize 3D segments online for forming 3D models to be compared and edited with an aerial image for enhancing efficiency and accuracy for building-model reconstruction.

The second purpose of the present invention is to connect with the photogrammetric mapping system for online building-model reconstruction.

The third purpose of the present invention is to directly connect with 3D segments obtained from the photogrammetric mapping system for forming candidate 3D building models yet with the first priority of candidate output after evaluation to save time for manual interpretation and, when difficult interpretation or topological error happens, the candidates can be used to be compared with an aerial image.

The fourth purpose of the present invention is to digitize 3D segments in the photogrammetric mapping system to directly form 3D building models for enhancing efficiency and accuracy for building-model reconstruction.

To achieve the above purposes, the present invention is a method of online building-model reconstruction using a photogrammetric mapping system, comprising steps of: (a) connecting a photogrammetric mapping system to access three-dimensional (3D) structural lines of a stereo scene in an image space of the photogrammetric mapping system at real time; and (b) reconstructing building models by using the 3D structural lines, where the 3D structural lines are polylines digitized into continuous 3D segments; and where step (b) comprises steps of: (b1) obtaining the 3D structural lines to obtain two-dimensional (2D) segments through snapping, cracking and removing lines; (b2) closing the 2D segments with 2D coordinates of vertices of the 2D segments to obtain 2D primitives with a topology of the 2D primitives; (b3) obtaining the 3D structural lines and the 2D primitives to obtain 3D building models; and (b4) backprojecting the 3D building models onto the image space to process overlapping and comparison to confirm correctness of the 3D building models. Accordingly, a novel method of online building-model reconstruction using a photogrammetric mapping system is obtained.

BRIEF DESCRIPTIONS OF THE DRAWINGS

The present invention will be better understood from the following detailed description of the preferred embodiment according to the present invention, taken in conjunction with the accompanying drawings, in which FIG. 1 is the structural view showing the preferred embodiment according to the present invention;

FIG. 6 is the view showing the roof fitting process;

FIG. 11 is the view showing the photogrammetric mapping systems.

DESCRIPTION OF THE PREFERRED EMBODIMENT(S)

The following description of the preferred embodiment is provided to understand the features and the structures of the present invention.

Figure 1:
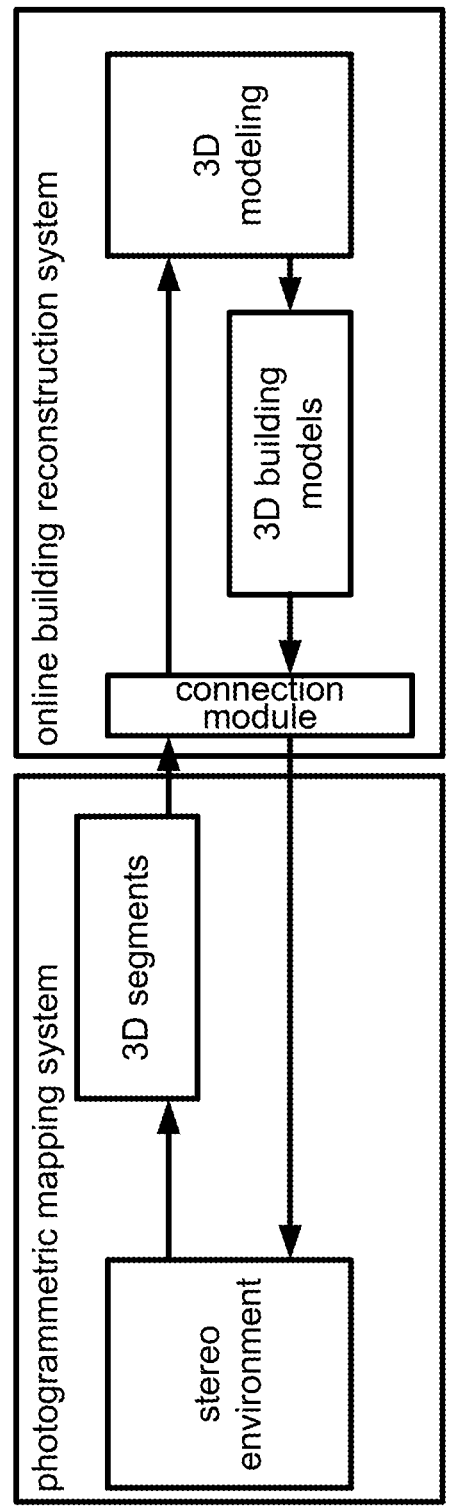
Figure 2:
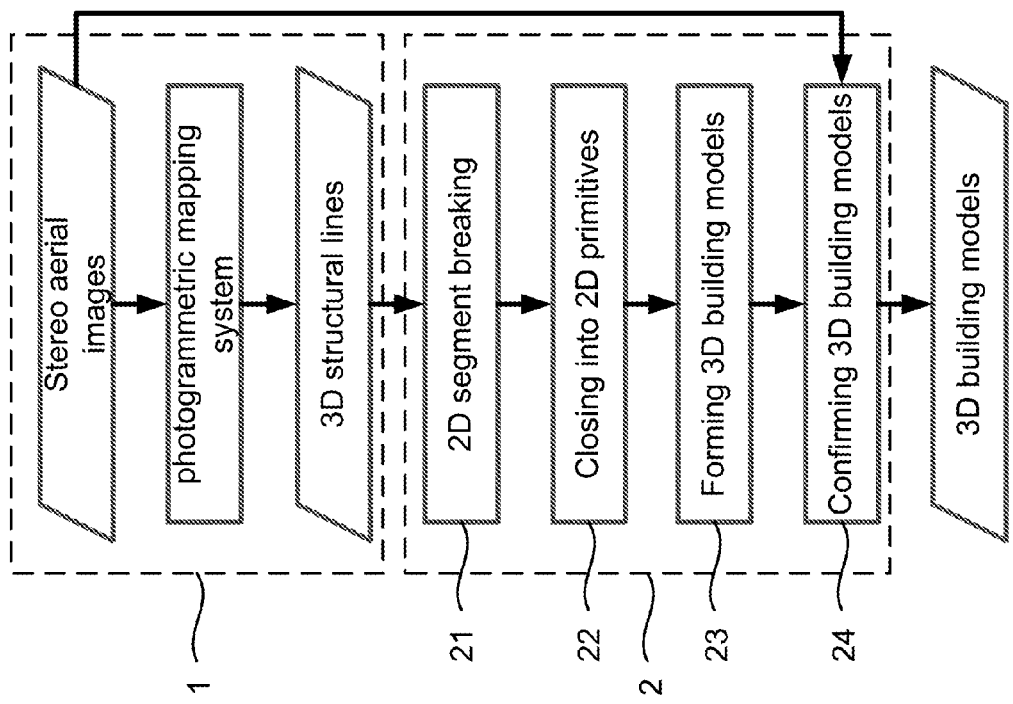
FIG. 2 is the flow view showing the preferred embodiment.

Please refer to FIG. 1 and FIG. 2, which are a structural view and a flow view showing a preferred embodiment according to the present invention. As shown in the figures, the present invention is a method of online building-model reconstruction using a photogrammetric mapping system, where a photogrammetric mapping system is used to measure 3D segments for constructing 3D building models to be compared and edited with an aerial stereo image for improving efficiency and accuracy for the building-model reconstruction. A computer-aided design (CAD) software MicroStation is used for developing the present invention, where the software can be coordinated with different photogrammetric mapping systems for easy digitization. The present invention comprises the following steps:

(a) Online-accessing 3D structural lines 1: A photogrammetric mapping system is connected for accessing an aerial stereo image of a stereo scene in an image space online. Three-dimensional (3D) structural lines in the aerial stereo image are digitized into 3D polylines.

(b) Reconstructing building models 2: In a computer-aided design system of an online reconstruction module, 3D coordinates of the 3D structural lines (3D polylines) are used to process 3D modeling for reconstructing 3D building models and returning the 3D building models to the photogrammetric mapping system for planar and stereo presentations. At last, the reconstructed 3D building models are backprojected onto the image space for overlapping and comparing for confirming accuracy of the 3D building models according to the original aerial stereo image.

Figure 3:
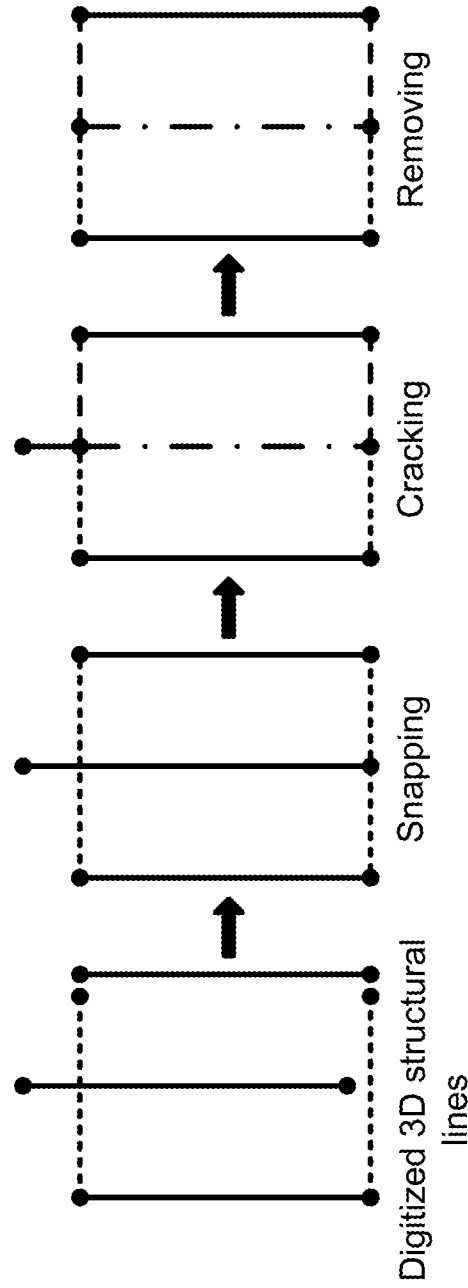
FIG. 3 is the flow view showing the 2D segment breaking process.

Please further refer to FIG. 3 to FIG. 10B, which are a flow view showing 2D segment breaking process; views showing 2D segments before and after being closed into polygons; views showing the 3D structural lines with height data and 2D primitives obtained form the 3D structural lines; a view showing roof fitting process; views showing a first, a second and a third candidate roof models; views showing a building roof and a 3D building model; a view showing backprojection of a 3D building model; and a view showing 3D building model confirmation. As shown in the figures, the above step (b) comprises the following steps:

(b1) Processing 2D segment breaking 21: In FIG. 3, the digitized 3D structural lines are obtained to figure out two-dimensional (2D) segments through snapping, cracking and removing lines. The 2D segments are figured out through the following steps:

(b11) The 3D segments of the 3D structural lines are temporary turned into 2D segments on a plane to obtain intersections of the 2D segments.

(b12) the 2D segments are broken into new 2D segments by the intersections.

Therein, if any vertex of a 2D segment has a distance to another 2D segment and a value of the distance is not bigger than a measurement error, the 2D segment is automatically extended to the another 2D segment to obtain an intersection at the vertex. If only one vertex of the 2D segment is not intersected with another 2D segment, the 2D segment is identified as a dangling segment and is removed.

(b2) Closing into 2D primitives 22: 2D primitives are formed from the 2D segments with a topology of the 2D primitives, where the 2D primitives are 2D polygons and the 2D primitives are obtained by closing the 2D segments with 2D coordinates of vertices of the 2D segments. The 2D primitives are obtained through the following steps:

(b21) Building blocks are formed from the 2D segments. Outlines and inner lines of each building block are separated to obtain shared lines (i.e. inner lines) in each building block. Therein, the building block comprises a plurality of the 2D segments not connected with the other 2D segments; and, the outlines of the building block comprises 2D segments obtained by tracing the 2D segments of the building block in an anti-clockwise direction.

(b22) An index of count numbers of the 2D coordinates of the extremities of the 2D segments is built. Therein, the index of the count numbers is built with consideration of the shared lines, where the count number of each vertex of the shared lines is added by 1 for later polygon-closing process.

(b23) A upper left corner point of a building block is used as a starting point to trace the 2D segments of the building block in a clockwise direction.

(b24) A next point in the building block is obtained with reference to the count numbers of the 2D coordinates of the next point.

(b25) Another next point is obtained repeatedly until back to the starting point to obtain a closed 2D polygon as a 2D primitive and a topology of the 2D primitive is recorded;

(b26) Step (b23) to step (b25) are processed repeatedly from a point in the building blocks yet not included in the closed 2D polygon to obtain all of the 2D primitives in the building block.

(b27) Step (23) to step (26) are processed repeatedly to obtain all of the 2D primitives in all of the building blocks.

Figure 4A:
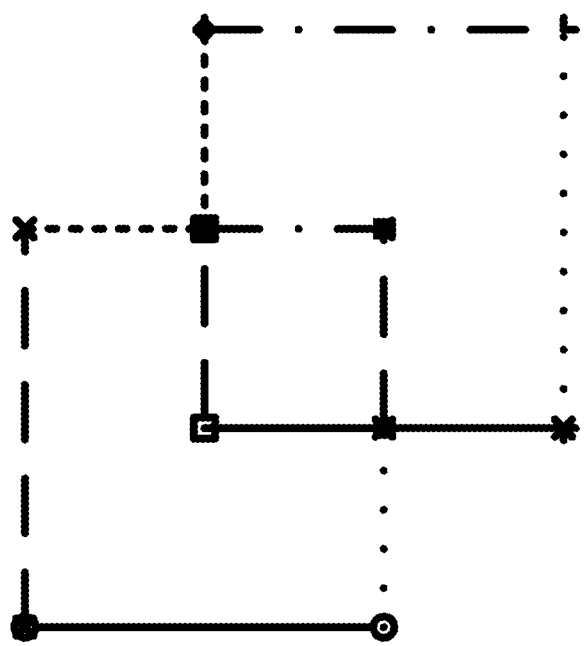
FIG. 4A is the view showing the 2D segments before being closed into polygons.
Figure 4B:
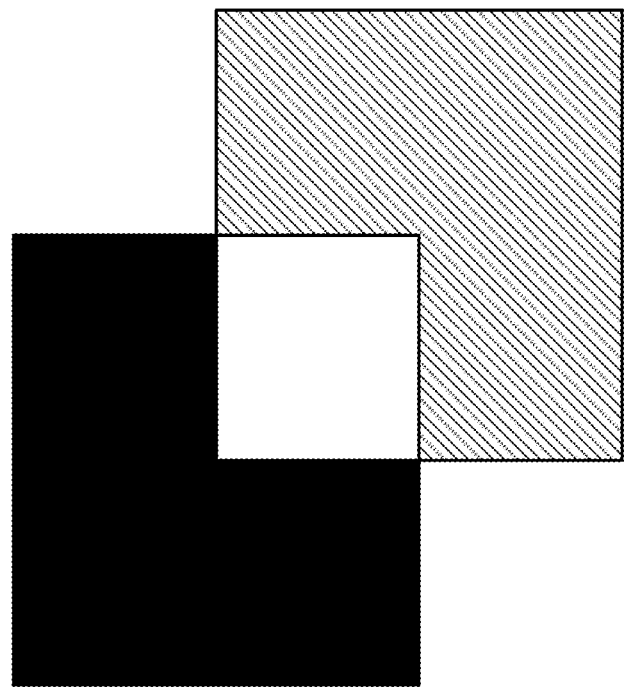
FIG. 4B is the view showing the 2D segments after being closed into polygons.

In FIG. 4A, 4 inner lines and the other 8 outlines are separated out of 12 structural lines; and, in FIG. 4B, 3 closed polygons are figured out.

(b3) Forming 3D building models 23: The 3D structural lines and the 2D primitives are obtained to form 3D building models. The 3D building models are formed through the following steps:

(b31) The 3D structural lines and the 2D primitives are compared according to 3D coordinates of the 3D structural lines and 2D coordinates of the 2D primitives. Thus, relationships between the 3D structural lines and the 2D primitives are obtained.

(b32) Heights of the 3D structural lines are used to form polygon roof surfaces.

(b33) Roof fitting is processed to form 3D building models by using a planar formula under coplanarity condition.

Figure 5A:
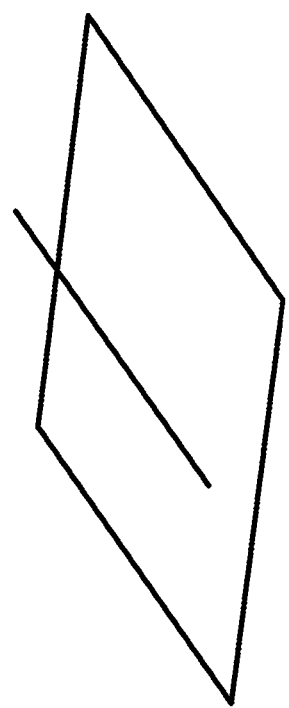
FIG. 5A is the view showing the 3D structural lines with the height data.
Figure 5B:
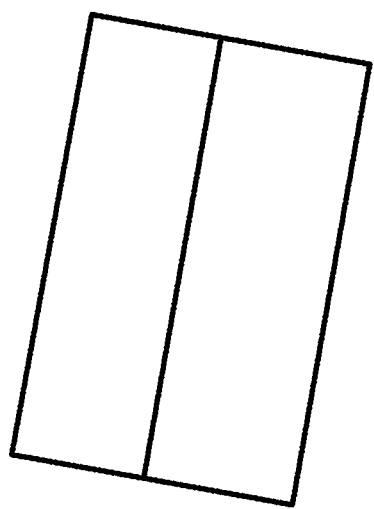
FIG. 5B is the view showing the 2D primitives obtained form the 3D structural lines.
Figure 7A:
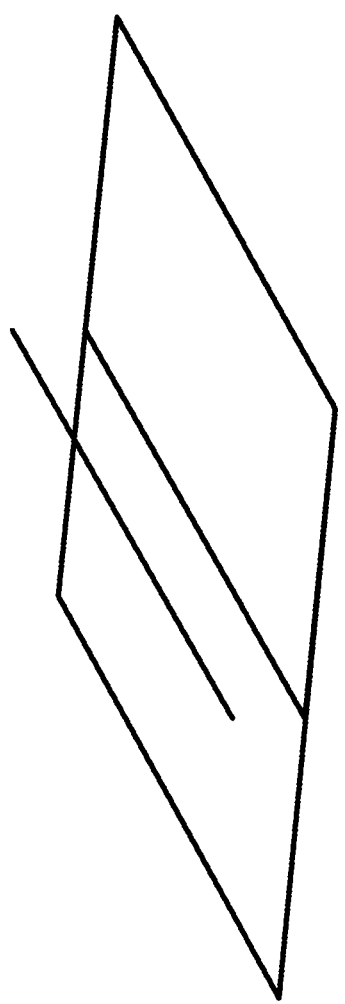
FIG. 7A is the view showing the first candidate roof model.
Figure 7B:
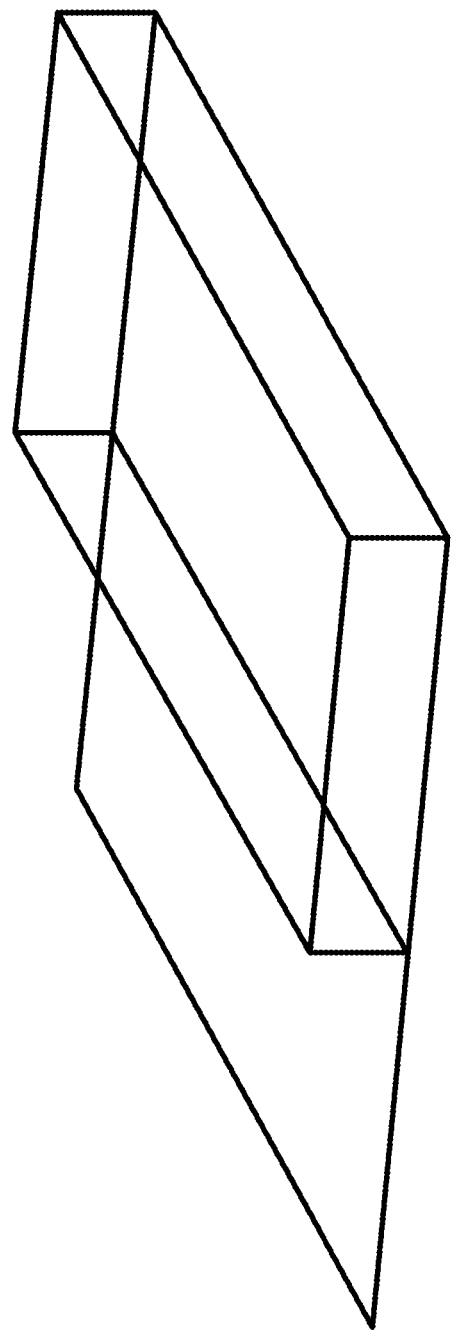
FIG. 7B is the view showing the second candidate roof model.
Figure 7C:
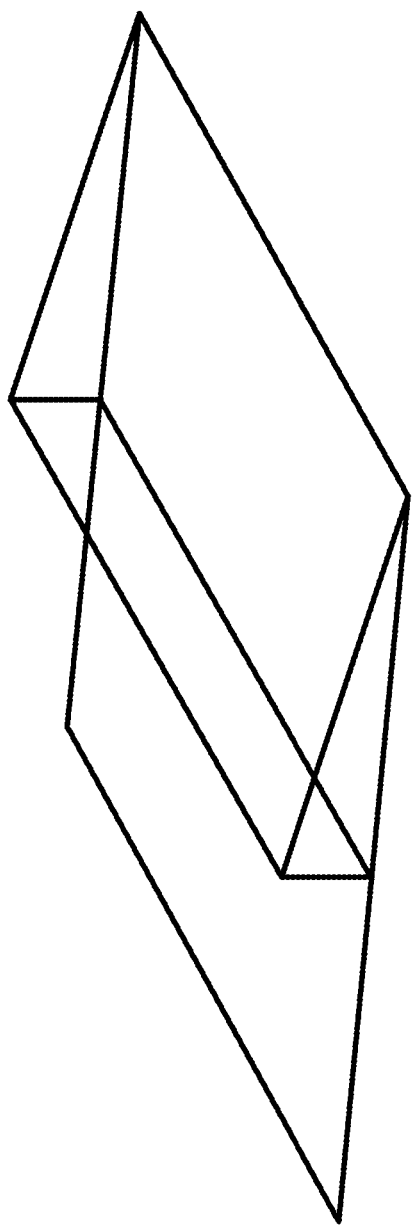
FIG. 7C is the view showing the third candidate roof model.
Figure 8:
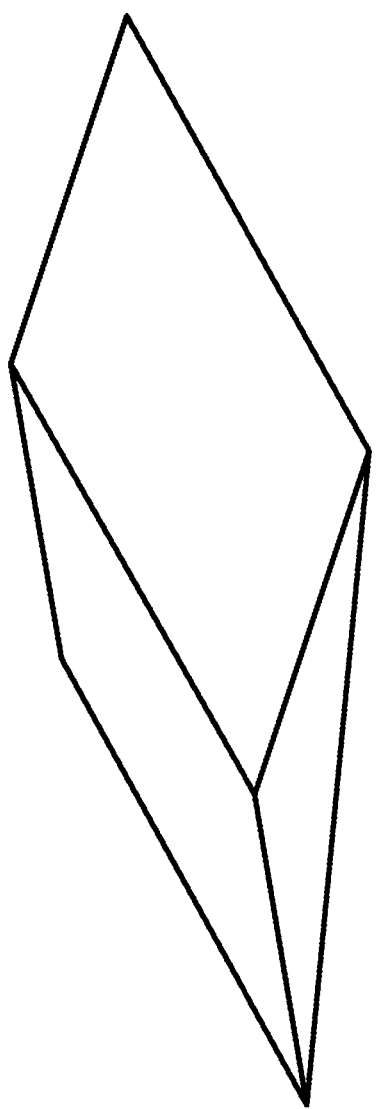
FIG. 8 is the view showing the building roof.
Figure 9:
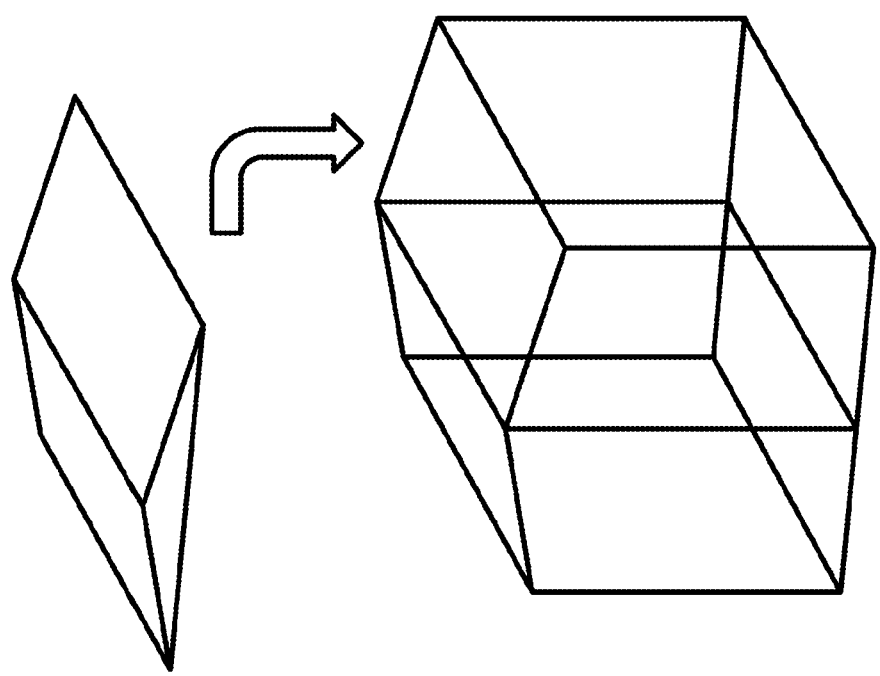
FIG. 9 is the view showing the 3D building model.

In FIG. 5A, the 3D structural lines have their heights data. In FIG. 5B, 2D closed polygons as 2D primitives are formed from the 2D segments. In FIG. 6, a planar formula '$z=ax+by+c$' is used to obtain planar parameters for roof fitting. On roof fitting, a plurality of candidate roof models of a 3D building model is automatically obtained. In FIG. 7A, a first candidate roof model is formed with three separated roof edge lines. In FIG. 7B, a second candidate roof model is formed with the highest ridge line. In FIG. 7C, a third candidate roof model has a slant roof plane formed with the highest ridge line and a roof edge line. In FIG. 8, a whole roof shape is formed by repeatedly processing steps shown in FIG. 7A to FIG. 7C. In FIG. 9, a 3D building model is formed with the whole roof shape according to height data and ground data.

Figure 10A:
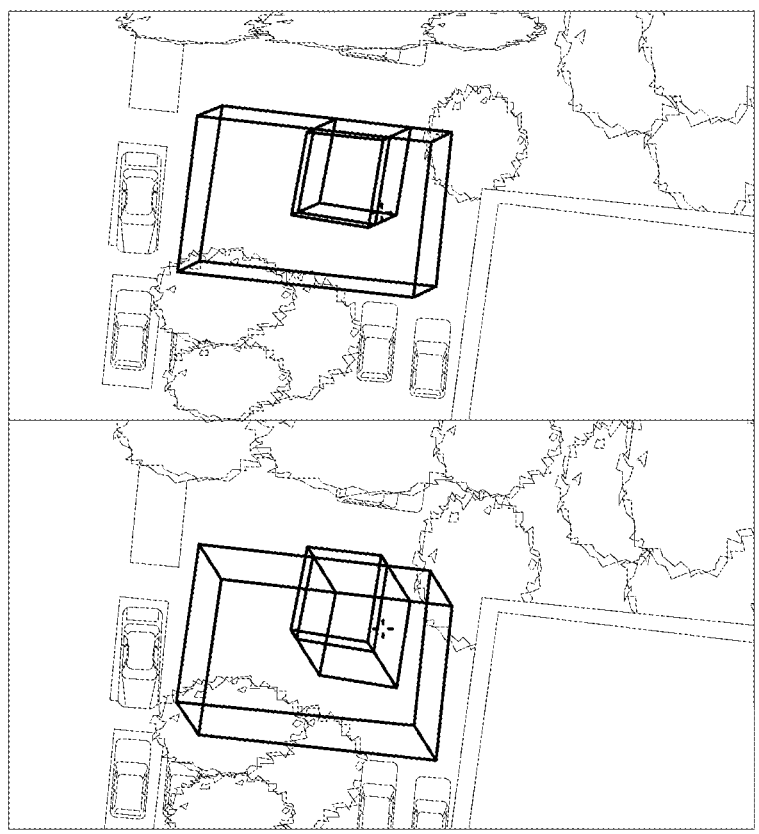
FIG. 10A is the view showing the backprojection of the 3D building model.
Figure 10B:
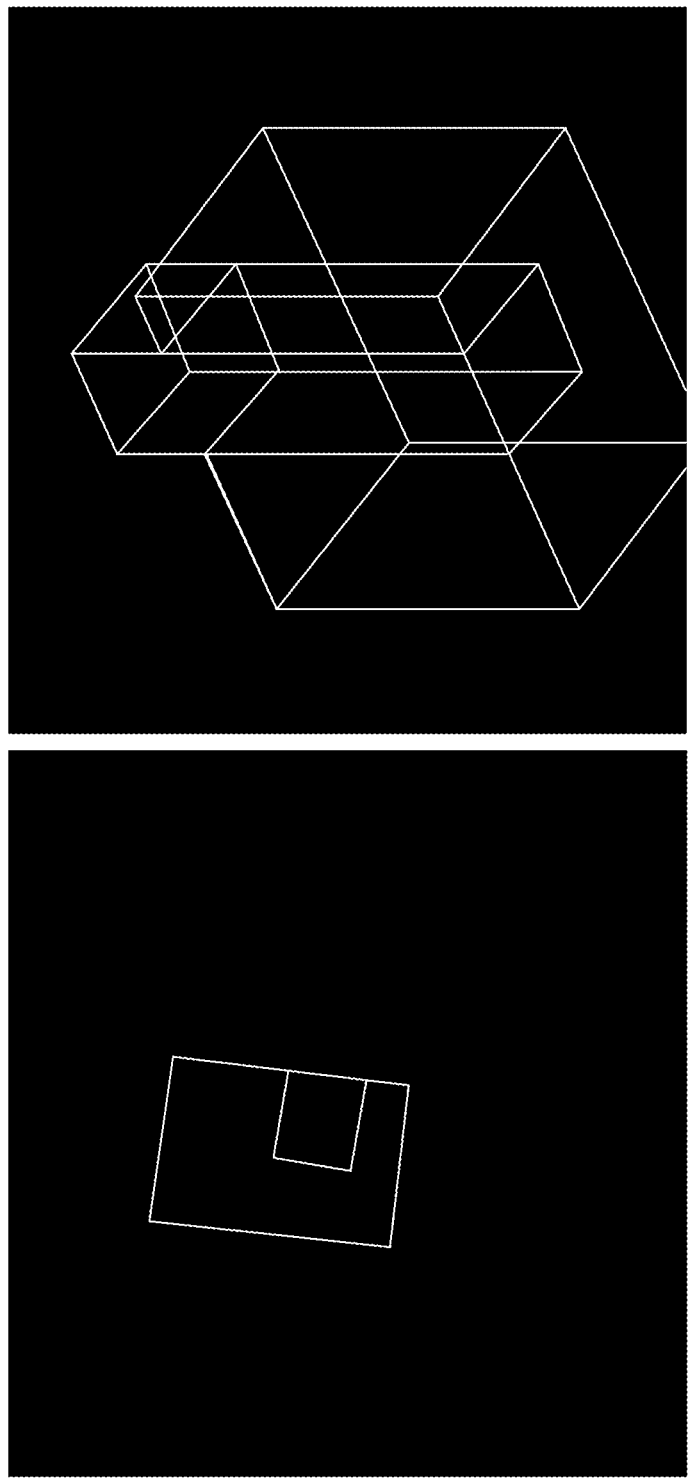
FIG. 10B is the view showing the 3D building model confirmation.

(b4) Confirming 3D building models 24: In FIG. 10A and FIG. 10B, a 3D building model is backprojected onto the image space to confirm accuracy of the 3D building model by overlapping and comparing. All the 3D building models are backprojected for confirmation.

The present invention directly connects with 3D segments obtained from a photogrammetric mapping system. The 3D segments are digitized online for forming 3D models to be compared and edited with stereo aerial images. Thus, efficiency and accuracy for building-model reconstruction are enhanced. The present invention obtains a plurality of candidate building models yet with the first priority of candidate outputted after evaluation to save time for manual interpretation. Furthermore, when difficult interpretation or topological error happens, the candidates can be used to be compared with the aerial images. Hence, the present invention fully uses the data for online processes in 3D applications with enhanced efficiency and accuracy.

To sum up, the present invention is a method of online building-model reconstruction using a photogrammetric mapping system, where a photogrammetric mapping system is connected to measure 3D segments for forming 3D building models to be compared and edited with an aerial images for enhancing efficiency and accuracy of building-model reconstruction.

The preferred embodiment herein disclosed is not intended to unnecessarily limit the scope of the disclosure. Therefore, simple modifications or variations belonging to the equivalent of the scope of the claims and the instructions disclosed herein for a patent are all within the scope of the present invention.

What is claimed is:

1. A method of online building-model reconstruction using a photogrammetric mapping system, comprising steps of:
   (a) connecting a photogram metric mapping system with an online building reconstruction system to access three-dimensional (3D) structural lines of a stereo scene in an image space of said photogrammetric mapping system at real time,
      wherein said 3D structural lines are polylines digitized into continuous 3D segments; and
   (b) reconstructing building models by using said 3D structural lines.

2. The method according to claim 1,
   wherein, in step (a), said 3D segments of said 3D structural lines are digitalized through manual measurement from said stereo scene in said image space; and
   wherein 3D coordinates of said 3D segments of said 3D structural lines are read from and written into a computer aided design (CAD) system simultaneously through a connecting module.

3. The method according to claim 1,
   wherein step (b) comprises steps of:
   (b1) obtaining said 3D structural lines to obtain two-dimensional (2D) segments through snapping, cracking and removing lines;
   (b2) closing said 2D segments by 2D coordinates of vertices of said 2D segments to obtain 2D primitives with a topology of said 2D primitives;
   (b3) obtaining said 3D structural lines and said 2D primitives to obtain 3D building models; and
   (b4) backprojecting said 3D building models onto said image space to process overlapping and comparison to confirm accuracy of said 3D building models.

4. The method according to claim 3,
   wherein step (b1) comprises steps of:
   (b11) turning said 3D segments of said 3D structural lines into 2D segments on a plane and obtaining intersections of said 2D segments regarding the manual measurement accuracy; and
   (b12) breaking said 2D segments into new 2D segments by said intersections,
      wherein, if any one of said vertices of one of said 2D segments has a distance to another one of said 2D segments and a value of said distance is not bigger than a measurement error, said one of said 2D segments is automatically extended to said another one of said 2D segments to obtain an intersection at said one of said vertices of said 2D segments; and
      wherein, if only one of said vertices of said one of said 2D segments is not intersected with another one of said 2D segments, said one of said 2D segments is a dangling segment and is removed.

5. The method according to claim 3,
   wherein step (b2) comprises steps of:
   (b21) obtaining building blocks from said 2D segments and separating outlines and inner lines of each one of said building blocks to obtain shared lines in each one of said building blocks;
   (b22) obtaining an index of count numbers of said 2D coordinates of said extremities of said 2D segments, wherein said index of said count numbers is obtained with consideration of said shared lines;
   (b23) using a corner point of one of said building blocks as a starting point to trace said 2D segments of said one of said building blocks in a clockwise direction;
   (b24) obtaining a next point in said one of said building blocks with reference to said count numbers of said 2D coordinates of said next point;
   (b25) repeatedly obtaining another next point until back to said starting point to obtain a closed 2D polygon as a 2D primitive and recording a topology of said 2D primitive;
   (b26) repeatedly processing step (b23) to step (b25) from a point in said building blocks yet not included in said closed 2D polygon to obtain all of said 2D primitives in said one of said building blocks; and
   (b27) repeatedly processing step (23) to step (26) obtain all of said 2D primitives in all of said building blocks.

6. The method according to claim 5,
   wherein, in step (b21), said building block comprises a plurality of said 2D segments not connected with the other ones of said 2D segments; and
   wherein, in step (b21), said outlines of said building block comprises said 2D segments obtained by tracing said 2D segments of said one of said building blocks in an anti-clockwise direction.

7. The method according to claim 3,
   wherein step (b3) comprises steps of:
   (b31) comparing said 3D structural lines and said 2D primitives according to 3D coordinates of said 3D structural lines and 2D coordinates of said 2D primitives to obtain relationships between said 3D structural lines and said 2D primitives;
   (b32) using heights of said 3D structural lines to obtain polygon roof surfaces; and
   (b33) processing roof fitting to obtain said 3D building models by using a planar formula under coplanarity condition.

8. The method according to claim 3,
   wherein, in step (b3), a plurality of candidate roof models of each one of said 3D building models are obtained and, in step (b4), said candidate roof models are back-projected to choose and confirm each one of said roof shapes of each one of said 3D building models to further build said 3D building models.

* * * * *